(12) United States Patent  
Naruse

(10) Patent No.: US 8,785,290 B2  
(45) Date of Patent: Jul. 22, 2014

(54) METHOD FOR MANUFACTURING SEMICONDUCTOR DEVICE HAVING ELEMENT ISOLATION PORTIONS

(71) Applicant: Canon Kabushiki Kaisha, Tokyo (JP)

(72) Inventor: Hiroaki Naruse, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/746,532

(22) Filed: Jan. 22, 2013

(65) Prior Publication Data

US 2013/0200485 A1 Aug. 8, 2013

(30) Foreign Application Priority Data

Feb. 2, 2012 (JP) ................. 2012-021337

(51) Int. Cl.
*H01L 21/76* (2006.01)
(52) U.S. Cl.
USPC ........... 438/400; 438/423; 438/424; 438/429; 438/435; 257/E21.54; 257/E21.545; 257/E21.551
(58) Field of Classification Search
USPC .......... 438/400, 423, 424, 429, 435; 257/E21.54, E21.545, E21.551
See application file for complete search history.

(56) References Cited

U.S. PATENT DOCUMENTS

| 7,187,023 | B2 | 3/2007 | Yoshihara |
| 7,851,838 | B2 | 12/2010 | Yoshihara |
| 7,936,036 | B2 | 5/2011 | Tanaka et al. |
| 2007/0221973 | A1 | 9/2007 | Nagasaki et al. |
| 2010/0167449 | A1 | 7/2010 | Yoshihara |

FOREIGN PATENT DOCUMENTS

| JP | 2005-347325 A | 12/2005 |
| JP | 2007-288136 A | 11/2007 |
| JP | 2009-224585 A | 10/2009 |
| JP | 2009-277722 A | 11/2009 |

*Primary Examiner* — Thanh V Pham  
(74) *Attorney, Agent, or Firm* — Fitzpatrick, Cella, Harper & Scinto

(57) ABSTRACT

A method for manufacturing a semiconductor device, the method comprising, forming an opening in an insulating layer, which is formed on a semiconductor substrate, using a photoresist pattern formed on the insulating layer as a mask, forming a first element isolation portion in the semiconductor substrate by implanting an ion into the semiconductor substrate using the photoresist pattern as a mask, forming a second element isolation portion, in the semiconductor substrate, whose outer edge is outside an outer edge of the opening, by implanting an ion into the semiconductor substrate through the opening, and forming a third element isolation portion, which is inside the outer edge of the second element isolation portion, by embedding an insulating member in the opening and removing the insulating layer.

7 Claims, 2 Drawing Sheets

METHOD FOR MANUFACTURING SEMICONDUCTOR DEVICE HAVING ELEMENT ISOLATION PORTIONS

BACKGROUND OF THE INVENTION

1. Field of the Invention

The present invention relates to a semiconductor device and a method for manufacturing the same.

2. Description of the Related Art

Element isolation such as LOCOS or STI can be mainly used in a semiconductor device. Japanese Patent Laid-Open No. 2005-347325 discloses an element isolation structure including an insulating member arranged in the upper portion of a semiconductor substrate, and a T-shaped, P-type semiconductor region formed in its lower portion. Such a structure can reduce the influence of, for example, noise generated due, for example, to a lattice defect at the interface between the insulator region and the semiconductor region on the circuit operation.

However, it is difficult for the method described in Japanese Patent Laid-Open No. 2005-347325 to warrant stable manufacture due to accumulation of an error, which occurs in the size of an opening formed to implant an impurity, and a resultant error which occurs in the thickness of an insulating film formed in this opening.

SUMMARY OF THE INVENTION

It is an object of the present invention to provide a technique advantageous in terms of manufacturing a semiconductor device including a highly stable element isolation region.

One of the aspects of the present invention provides a method for manufacturing a semiconductor device, the method comprising, forming an opening in an insulating layer, which is formed on a semiconductor substrate, using a photoresist pattern formed on the insulating layer as a mask, forming a first element isolation portion in the semiconductor substrate by implanting an ion into the semiconductor substrate using the photoresist pattern as a mask, forming a second element isolation portion, in the semiconductor substrate, whose outer edge is outside an outer edge of the opening, by implanting an ion into the semiconductor substrate through the opening, and forming a third element isolation portion, which is inside the outer edge of the second element isolation portion, by embedding an insulating member in the opening and removing the insulating layer.

Further features of the present invention will become apparent from the following description of exemplary embodiments with reference to the attached drawings.

DESCRIPTION OF THE EMBODIMENTS

Two embodiments are explained with reference to FIGS. 1A to 2F as follows. In the following explanation, an 'outer edge' means, for each of the components, an outer edge obtained by being orthographically-projected onto a surface of a semiconductor substrate. In a case of comparing these outer edges to each other, they are compared based on the orthogonal projection onto the surface.

<First Embodiment>

Figure 1A:
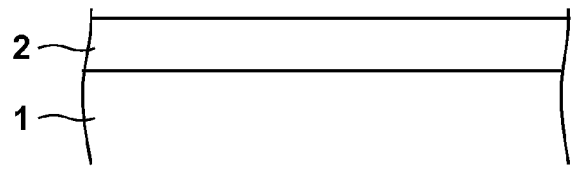
FIGS. 1A to 1F are sectional views for explaining a method for manufacturing a semiconductor device according to the first embodiment.

A method for manufacturing a semiconductor device according to the first embodiment will be described with reference to FIGS. 1A to 1F. First, an insulating layer 2 is formed on a semiconductor substrate (for example, n-type silicon) 1 (insulating layer forming step), as illustrated in FIG. 1A. The insulating layer 2 may be a single layer or a multilayer. Also, the insulating layer 2 can contain, for example, silicon oxide and silicon nitride, and function as, for example, a mask in impurity implantation and thermal oxidation processes, or a stopper in a polishing step that uses the CMP method. More specifically, the insulating layer 2 has a multilayer structure in which a silicon nitride layer is formed on a silicon oxide layer.

Figure 1B:
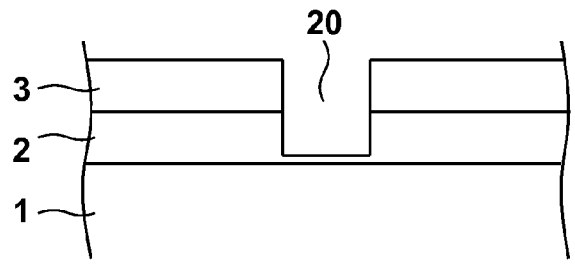
Figure 1C:
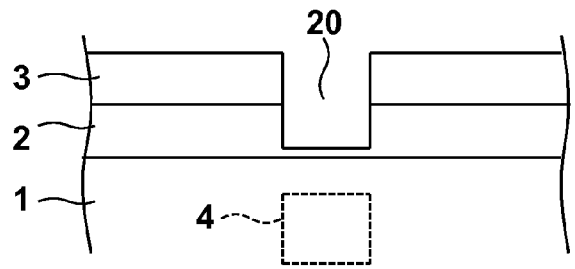

A photoresist pattern 3 is formed on the insulating layer 2, and the insulating layer 2 is etched using it, thereby forming an opening 20 in the insulating layer 2 (opening forming step), as illustrated in FIG. 1B. At this time, the opening 20 may be formed so that the semiconductor substrate 1 is completely exposed or is partially exposed, that is, the insulating layer 2 or its silicon oxide layer partially remains, as illustrated in FIG. 1B. Note that the opening may have a closed loop shape with no side surfaces. A first element isolation portion 4 is formed (first element isolation portion forming step), as illustrated in FIG. 1C. The first element isolation portion 4 can be formed by implanting an impurity (an ion) into the semiconductor substrate 1 through the opening 20. This impurity implantation operation can be done using, for example, implantation of boron (B) at a concentration of about $1 \times 10^{12}$ to $1 \times 10^{14}/cm^2$. Also, this impurity implantation operation can be done using the photoresist pattern 3 as a mask.

Figure 1D:
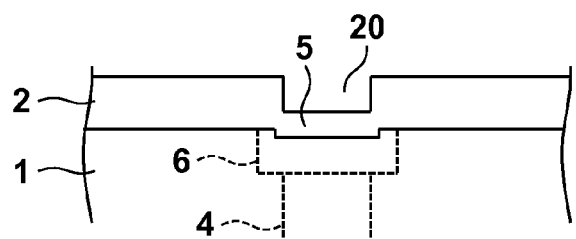

The photoresist pattern 3 can be removed, and a thermal oxidation process can be performed, thereby forming a silicon oxide film 5 on the surface of the semiconductor substrate 1, which corresponds to the opening 20. Note that another oxidation process may be performed in place of a thermal oxidation process. An impurity (an ion) is implanted into the semiconductor substrate 1 through the opening 20 to form a second element isolation portion 6 in the semiconductor substrate 1 to have an outer edge outside the outer edge defining the opening 20 (second element isolation portion forming step), as illustrated in FIG. 1D. This impurity implantation operation can be done using, for example, implantation of boron (B) at a concentration of about $1 \times 10^{12}$ to $1 \times 10^{14}/cm^2$. This impurity implantation operation can be done perpendicularly, obliquely, or both perpendicularly and obliquely to the substrate plane of the semiconductor substrate 1 (at an angle of, for example, 0° to 45°). With this operation, a second element isolation portion 6 can be formed to have an outer edge outside the outer edge defining a third element isolation portion 21 to be formed in the subsequent step. An impurity implantation operation for forming the second element isolation portion 6 can be done at an implantation intensity lower than that at which an impurity implantation operation for forming the first element isolation portion 4 is done. Note that the second element isolation portion 6 can also be formed by perpendicularly implanting an impurity into the semiconductor substrate 1, and performing a thermal oxidation process.

Figure 1E:
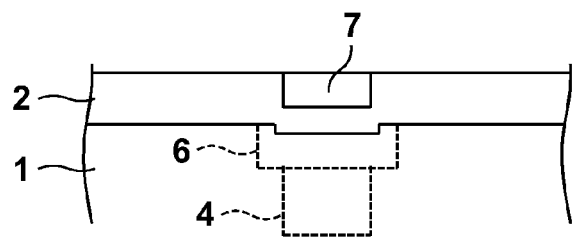
Figure 1F:
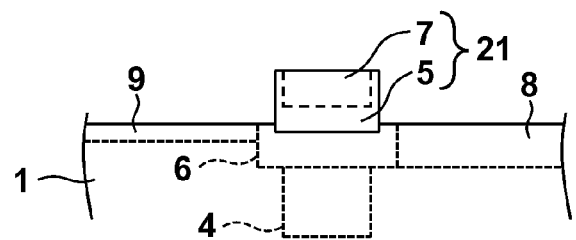

Lastly, an insulating member 7 is embedded in the opening 20, and the insulating layer 2 is removed, thereby forming an insulating, third element isolation portion 21 inside the outer edge of the second element isolation portion 6 (third element isolation portion forming step). More specifically, an insulating member (for example, silicon oxide) 7 is embedded in the opening 20 by, for example, the CVD method, and planarized by, for example, the CMP method. At this time, an abrasive which allows the insulating member 7 to be polished at a rate higher than the insulating layer 2 can be used. With this operation, the insulating layer 2 can act as a stopper so that the insulating member 7 is embedded in the opening 20, and portions other than the insulating member 7 (on the insulating layer 2) are removed, as illustrated in FIG. 1E. The insulating layer 2 is removed by etching to form a third element isolation portion 21, as illustrated in FIG. 1F. Although the subsequent steps will not be described in detail hereinafter, a charge storage region 8 for a photoelectric conversion portion, a source/drain region 9 for a MOS transistor, and a gate (not shown) for the MOS transistor, for example, can be formed.

The first element isolation portion 4 is formed beneath the second element isolation portion 6, and the outer edge of the first element isolation portion 4 is formed inside the outer edge of the second element isolation portion 6, as shown in FIG. 1F. Forming another element isolation region in a deeper portion in this way makes it possible to suppress charge mixture in the deep portion of the substrate, so the element isolation effect is expected to improve. The second element isolation portion 6 can also function as a channel stop. The second element isolation portion 6 is formed outside the outer edge of the third element isolation portion 21, and can prevent a leakage current from the end portion of the third element isolation portion 21 from mixing in the element. Note that letting W1 be the width of the first element isolation portion 4, W2 be the width of the second element isolation portion 6, and W3 be the width of the third element isolation portion 21, W2>W1 and W2>W3 preferably hold. The first element isolation portion 4 and second element isolation portion 6 may be formed to partially overlap each other. The depths of the first element isolation portion 4 and second element isolation portion 6 can be determined from an impurity concentration defined by, for example, the position of an impurity concentration peak.

Upon the above-mentioned operation, a semiconductor device including a second element isolation portion 6 formed in the upper portion of a semiconductor substrate 1, a first element isolation portion 4 formed beneath the second element isolation portion 6, and a third element isolation portion 21 which is formed on the second element isolation portion 6 and includes an insulating member can be obtained. The third element isolation portion 21 has an outer edge formed inside the outer edge of the second element isolation portion 6. Covering the interface between the third element isolation portion 21 and the semiconductor substrate 1 with the second element isolation portion 6 makes it possible to reduce the influence of, for example, noise generated due, for example, to a lattice defect at this interface, so a semiconductor device including a highly stable element isolation region can easily be manufactured.

Although a first element isolation portion 4 is formed before a thermal oxidation process in this embodiment, it may be formed after a thermal oxidation process. Also, the order of the step of forming a first element isolation portion 4, and the step of forming a second element isolation portion 6 may be reversed. In this case, a second element isolation portion 6 is formed and then a thermal oxidation process is performed, thereby forming it outside the outer edge of a third element isolation portion 21 to be formed later. A first element isolation portion 4 is then formed within the semiconductor substrate 1, thereby making it possible to generate a steep impurity concentration peak, and, in turn, to improve the element isolation performance.

<Second Embodiment>

Figure 2A:
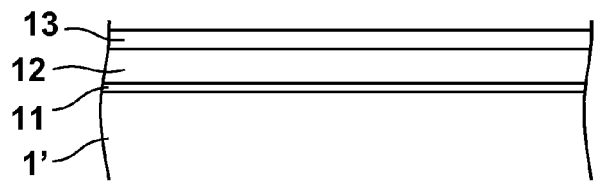
FIGS. 2A to 2F are sectional views for explaining a method for manufacturing a semiconductor device according to the second embodiment.

A method for manufacturing a semiconductor device according to the second embodiment will be described with reference to FIGS. 2A to 2F. In this embodiment, an element isolation region is formed using a method different from that in the first embodiment. Details which are the same as in the first embodiment will not be described hereinafter. First, a semiconductor substrate (for example, n-type silicon) 1' can be prepared, and the surface of the semiconductor substrate 1' can be oxidized, thereby forming a silicon oxide film 11, as illustrated in FIG. 2A. Further, a polysilicon film 12 can be formed on the silicon oxide film 11, and a silicon nitride film 13 can be formed on the polysilicon film 12 (insulating layer forming step). The silicon nitride film 13 can function as, for example, a mask in impurity implantation and thermal oxidation processes, or a stopper in a polishing step that uses the CMP method.

Figure 2B:
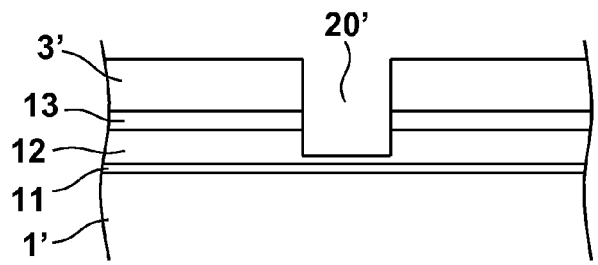
Figure 2C:
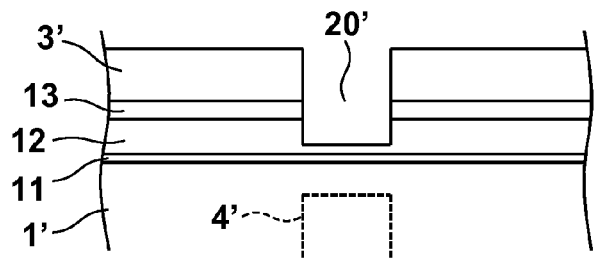

A photoresist pattern 3' is formed on the silicon nitride film 13, and the polysilicon film 12 and silicon nitride film 13 are etched using it, as illustrated in FIG. 2B. With this operation, an opening 20' is formed in the polysilicon film 12 and silicon nitride film 13 (opening forming step). At this time, the opening 20' may be formed so that the silicon oxide film 11 or semiconductor substrate 1 is completely exposed or is partially exposed, that is, the polysilicon film 12 partially remains, as illustrated in FIG. 2B. A first element isolation portion 4' is then formed (first element isolation portion forming step), as illustrated in FIG. 2C. The first element isolation portion 4' can be formed by implanting an impurity into the semiconductor substrate 1' through the opening 20'. This impurity implantation operation can be done using, for example, implantation of boron (B) at a concentration of about $1\times10^{12}$ to $1\times10^{14}/cm^2$. Also, this impurity implantation operation can be done using the photoresist pattern 3' as a mask.

The photoresist pattern 3' can be removed, and a thermal oxidation process can be performed, thereby forming an oxide film 14 on the surface of the polysilicon film 12, which corresponds to the opening 20'. Depending on the thickness of the polysilicon film 12, an oxide film can also be formed on the surface of the semiconductor substrate 1'. An impurity is implanted into the semiconductor substrate 1' through the opening 20' to form a second element isolation portion 6' in the semiconductor substrate 1' to have an outer edge outside the outer edge defining the opening 20' (second element isolation portion forming step), as illustrated in FIG. 2C. This impurity implantation operation can be done using, for example, implantation of boron (B) at a concentration of about $1\times10^{12}$ to $1\times10^{14}/cm^2$. This impurity implantation operation can be done obliquely to the substrate plane of the semiconductor substrate 1'. For example, four impurity implantation operations are performed while rotating the implantation direction in steps of 90° within the substrate plane at an angle (implantation angle) of 15° to 45° from the normal to the substrate plane. This impurity implantation operation may be done while rotating the semiconductor substrate 1'. With this operation, a second element isolation portion 6' can be formed to have an outer edge outside the outer edge of a third element isolation portion 21' to be formed in the subsequent step.

Figure 2D:
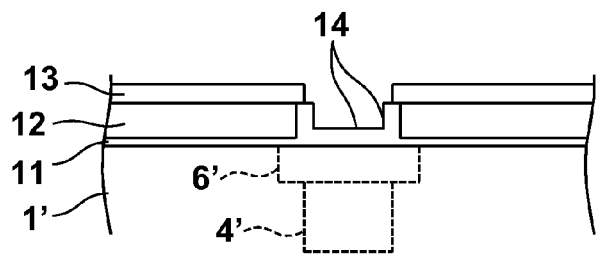
Figure 2E:
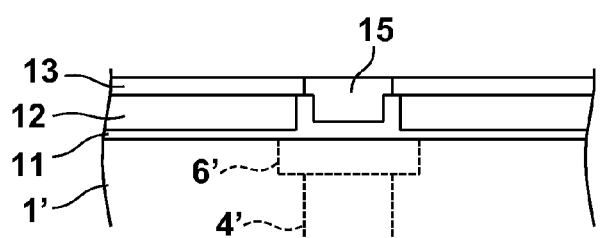
Figure 2F:
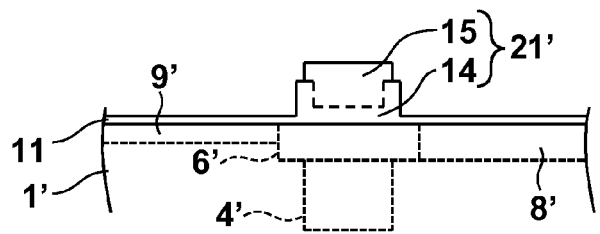

Lastly, an insulating member 15 is embedded in the opening 20', and the polysilicon film 12 and silicon nitride film 13 are removed, thereby forming an insulating, third element isolation portion 21' inside the outer edge of the second element isolation portion 6' (third element isolation portion forming step). More specifically, an insulating member (for example, silicon oxide) 15 is embedded in the opening 20' by, for example, the CVD method, and planarized by, for example, the CMP method. At this time, an abrasive which allows the insulating member 15 to be polished at a rate higher than the silicon nitride film 13 can be used. With this operation, the silicon nitride film 13 can act as a stopper so that the insulating member 15 is embedded in the opening 20', and portions other than the insulating member 15 (on the silicon nitride film 13) are removed, as illustrated in FIG. 2D. The silicon nitride film 13 and polysilicon film 12 can be removed to form a third element isolation portion 21', as illustrated in FIG. 2E. The silicon nitride film 13 can be selectively removed using, for example, thermal phosphoric acid. The polysilicon film 12 can be selectively removed using, for example, ammonia/hydrogen peroxide/water mixture. Although the subsequent steps will not be described in detail hereinafter, a charge storage region 8' for a photoelectric conversion portion, a source/drain region 9' for a MOS transistor, and a gate (not shown) for the MOS transistor, for example, can be formed.

Upon the above-mentioned operation, a semiconductor device including a second element isolation portion 6' formed in the upper portion of a semiconductor substrate 1', and a third element isolation portion 21' which is formed on the second element isolation portion 6', and includes an insulating member arranged inside the outer edge of the second element isolation portion 6' can be formed. Covering the interface between the third element isolation portion 21' and the semiconductor substrate 1' with the second element isolation element 6' makes it possible to reduce the influence of, for example, noise generated due, for example, to a lattice defect at this interface, so a semiconductor device including a highly stable element isolation region can easily be manufactured.

In the second embodiment, as in the first embodiment, the order of the step of forming a first element isolation portion, the step of forming a second element isolation portion, and the step of performing a thermal oxidation process can be changed as needed. Other manufacturing conditions can also be changed as needed.

Although two embodiments have been described above, the present invention is not limited to them, and the object, state, use purpose, function, and other specifications can be changed as needed, so the present invention can also be practiced by other embodiments, as a matter of course.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-021337, filed Feb. 2, 2012, which is hereby incorporated by reference herein in its entirety.

What is claimed is:

1. A method for manufacturing a semiconductor device, the method comprising:
    forming an opening in an insulating layer, which is formed on a semiconductor substrate, using a photoresist pattern formed on the insulating layer as a mask;
    forming a first element isolation portion in the semiconductor substrate by implanting an ion into the semiconductor substrate using the photoresist pattern as a mask;
    forming a second element isolation portion, in the semiconductor substrate, whose outer edge is outside an outer edge of the opening, by implanting an ion into the semiconductor substrate through the opening; and
    forming a third element isolation portion, which is inside the outer edge of the second element isolation portion, by embedding an insulating member in the opening and removing the insulating layer.

2. The method according to claim 1, wherein the forming the second element isolation portion is performed after the forming the first element isolation portion.

3. The method according to claim 2, further comprising:
    removing the photoresist pattern after the forming the first element isolation portion and before the forming the second element isolation portion.

4. The method according to claim 1, wherein, in the forming the first element isolation portion, the ion is implanted at an implantation intensity higher than an implantation intensity in the forming the second element isolation portion.

5. The method according to claim 1, wherein letting W1 be a width of the first element isolation portion, W2 be a width of the second element isolation portion, and W3 be a width of the third element isolation portion, W2>W1 and W2>W3.

6. A method for manufacturing a semiconductor device, the method comprising:
    forming an opening in an insulating layer, which is formed on a semiconductor substrate, using a photoresist pattern formed on the insulating layer as a mask;
    forming a first element isolation portion in the semiconductor substrate by implanting an ion into the semiconductor substrate using the photoresist pattern as a mask;
    removing the photoresist pattern after the forming the first element isolation portion;
    forming a second element isolation portion, in the semiconductor substrate, whose outer edge is outside an outer edge of the opening, by implanting an ion into the semiconductor substrate through the opening at an implantation intensity lower than an implantation intensity in the forming the first element isolation portion, after the removing the photoresist pattern; and
    forming a third element isolation portion, providing electrical insulation, which is inside the outer edge of the second element isolation portion, by embedding an insulating member in the opening and removing the insulating layer.

7. The method according to claim 6, wherein letting W1 be a width of the first element isolation portion, W2 be a width of the second element isolation portion, and W3 be a width of the third element isolation portion, W2>W1 and W2>W3.

* * * * *